(12) United States Patent
Park

(10) Patent No.: US 7,221,718 B2
(45) Date of Patent: May 22, 2007

(54) I/Q DEMODULATOR AND I/Q SIGNAL SAMPLING METHOD THEREOF

(75) Inventor: Chan-sub Park, Incheon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 763 days.

(21) Appl. No.: 10/354,078

(22) Filed: Jan. 30, 2003

(65) Prior Publication Data
US 2003/0165202 A1 Sep. 4, 2003

(30) Foreign Application Priority Data
Mar. 4, 2002 (KR) .............................. 2002-11362

(51) Int. Cl.
*H04L 27/14* (2006.01)
*H04L 27/16* (2006.01)
*H04L 27/22* (2006.01)

(52) U.S. Cl. .................... 375/324; 375/261; 375/268; 375/271; 375/279; 375/320; 375/329; 375/340; 375/349; 375/350

(58) Field of Classification Search ............... 375/261, 375/268, 271, 279, 320, 324, 329, 340, 349, 375/350
See application file for complete search history.

(56) References Cited

U.S. PATENT DOCUMENTS

| | | | | |
|---|---|---|---|---|
| 5,550,874 A | * | 8/1996 | Lee | 375/354 |
| 5,615,376 A | * | 3/1997 | Ranganathan | 713/322 |
| 5,850,422 A | * | 12/1998 | Chen | 375/371 |
| 6,151,367 A | * | 11/2000 | Lim | 375/326 |
| 6,243,430 B1 | * | 6/2001 | Mathe | 375/346 |
| 6,459,743 B1 | * | 10/2002 | Lipka | 375/329 |
| 6,477,657 B1 | * | 11/2002 | Kurd et al. | 713/501 |
| 6,993,108 B1 | * | 1/2006 | Chi et al. | 375/376 |
| 2005/0286619 A1 | * | 12/2005 | Haddadin et al. | 375/222 |

FOREIGN PATENT DOCUMENTS

| | | |
|---|---|---|
| CN | 93117669.7 | 7/1994 |
| CN | 96111760.5 | 6/1997 |
| JP | 11-032094 | 2/1999 |
| JP | 2001-500707 | 1/2001 |

OTHER PUBLICATIONS

Vaidyanathan, "Multirate Digital Filters, Filter Banks, Polyphase Networks, and Applications: A Tutorial", Proceedings of the IEEE, vol. 78, No. 1, Jan. 1990, pp. 56-93.
Office Action dated Dec. 21, 2004 issued from the Japanese Patent Office with respect to corresponding Japanese Patent Application No. 2003-49932, filed Feb. 26, 2003.
Office Action dated Apr. 8, 2005 issued from the Chinese Patent Office with respect to Chinese Patent Application No. 03106706.9 filed on Feb. 27, 2003.

* cited by examiner

*Primary Examiner*—David C. Payne
*Assistant Examiner*—Erin M. File
(74) *Attorney, Agent, or Firm*—Staas & Halsey LLP

(57) ABSTRACT

An I/Q demodulator optimized with a minimum amount of hardware. First and second multiplexers generate I and Q signals with respect to an input data signal; and first and second 2-decimation units decimate the I and Q signals generated by the first and second multiplexers, to output effective I and Q signals. A filtering unit filters the effective I and Q signals. As a result, a size of the hardware is reduced, and an operation frequency of the filter is reduced.

20 Claims, 14 Drawing Sheets

I/Q DEMODULATOR AND I/Q SIGNAL SAMPLING METHOD THEREOF

CROSS-REFERENCE TO RELATED APPLICATIONS

This application claims the benefit of Korean Application No. 2002-11362 filed Mar. 4, 2002, in the Korean Intellectual Property Office, the disclosure of which is incorporated herein by reference.

BACKGROUND OF THE INVENTION

1. Field of the Invention

The present invention relates to a demodulator for digital communication, and more particularly, to an In-phase/Quadrature-phase (I/Q) demodulator having an optimized hardware design, and a method of generating an I/Q signal using the optimized hardware.

2. Description of the Related Art

FIG. 1 shows a block diagram of a conventional I/Q demodulator which processes an input signal having a median frequency of $f_0$. When a sampling frequency output from an analog-to-digital (A/D) converter 10 is $$f_s = \frac{1}{T},$$

, the signal after the A/D converter 10 may be expressed by Equation 1. In Equation 1, T is an inverse number of the sampling frequency.

$$s(nT) = I(nT)\cos(nf_0T) + Q(nT)\sin(nf_0T) \qquad (1)$$

Multipliers 20 and 30 multiply the cos and sin to separate the signal, which is output from the A/D converter 10 and expressed by the Equation 1, into I/Q signals. The median frequency $f_0$ of the signal s(nT) falls to the baseband.

The signal generated by multiplying the Equation 1 by cos is expressed by Equation 2, and the signal generated by multiplying the Equation 1 by sin is expressed by Equation 3:

$$\frac{1}{2}I(nT) + \frac{1}{2}I(nT)\cos(2nf_0T) + \frac{1}{2}Q(nT)\sin(2nf_0T) \qquad (2)$$

$$\frac{1}{2}Q(nT) - \frac{1}{2}Q(nT)\cos(2nf_0T) + \frac{1}{2}I(nT)\sin(2nf_0T) \qquad (3)$$

Each of the I and Q signals, obtainable by the Equations 2 and 3, passes through low pass filters (LPF) 23 and 33, respectively, for an elimination of a double frequency component $2nf_0T$. When the sampling frequency $f_s$ is 4 times as high as the median frequency $f_0$ of the input signal, the Equation 4 is substituted into Equation 2, deriving Equations 5a and 5b:

$$f_s = 4 \times f_0 = \frac{1}{T} \qquad (4)$$

$$\cos(2nf_0/f_0T) = \cos(n\pi/2) = 1, 0, -1, 0, \ldots \; n=0,1,2,3, \qquad (5a)$$

$$\sin(2nf_0/f_0T) = \sin(n\pi/2) = 1, 0, -1, 0, \ldots \; n=0,1,2,3, \qquad (5b)$$

In Equation 5a, the cos-function is converted into 1, 0, −1, 0, . . . , and in Equation 5b the sin-function is converted into 0, 1, 0, −1, . . . . Accordingly, there is no need to use an NCO 40 for generating a sin value and a cos value, and the multipliers are useable as a mutiplexer.

FIG. 2 shows an example of an I/Q demodulator which uses a multiplexer instead of the multiplier to separate the I and Q signals. The multiplexer is useable where the sampling frequency $f_s$ is 4 times as high as the median frequency $f_0$ of the input signal.

The I signal and the Q signal are derived as the input signal is digitalized by the A/D converter 10 and passed through first and second multiplexers 21 and 31, respectively and first and second LPFs 23 and 33, respectively. The multiplexer separates the digitalized signal from the A/D converter 10 into an inphase (I) signal and a quadrature (Q) signal. The first multiplexer 21 obtains the I signal, and the second multiplexer 31 obtains the Q signal.

The first multiplexer 21 multiplies the input data signal sequentially by 1, 0, −1, 0 and thereby outputs the I signal, while the second multiplexer 31 multiplies the input data signal sequentially by 0, 1, 0, −1 and outputs the Q signal. The I and Q signals, which are output from first and second multiplexers 21 and 31, respectively, are filtered through the first and second LPFs 25 and 35, respectively, to eliminate the double frequency component from the I and Q signals. The filtered I and Q signals are 2-decimated by 2-decimation units 25 and 35, respectively.

As described above, output from the A/D converter 10 is divided and input to the I signal area and Q signal area, and the input data signals are multiplied respectively by cos- and sin, generating I and Q signals. LPFs 23, 33 are also provided to eliminate the double frequency component of I and Q signals.

FIG. 3A is a block diagram of a conventional resampling unit. The conventional resampling unit 30 includes an L-upsampling unit 22, an LPF 23, an M-down sampling unit 24 and a 2-decimation unit 25.

The L-upsampling unit 22 and the M-downsampling unit 24 sample the input data signals to obtain a certain form of signals. For example, input data signals of data (0), data (1), data (2), data (3), . . . are upsampled with an upsampling coefficient of L=3 to data (0), 0, 0, data (1), 0, 0, data (2), 0, 0, data (3), . . . and down sampled with a downsampling coefficient of M=3 to data (0), data (1), data (2), data (3), . . . . The up and down sampled signal is 2-decimated by the 2-decimation unit 25. An output signal from the resampling unit 30, L×f_in/M, is the input signal f_in which has been sampled by the L-upsampling unit 22 and the M-down sampling unit 24 and 2-decimated by the 2-decimation unit 25.

FIG. 3B is a block diagram of an I/Q demodulator comprising a resampling unit 100 which incorporates two of the resampling units 30.

Resampling unit 100 generates I and Q signals by the multiplication by first and second multiplexers 21 and 31, respectively, of the data signals output from the A/D converter 10 by cos and sin, respectively.

For the I and Q signals generated as described above with reference to FIG. 1, LPFs 23, 33 are provided to eliminate the signals generated at the double frequency.

SUMMARY OF THE INVENTION

Accordingly, it is an aspect of the present invention to provide an I/Q demodulator which may be optimized in hardware and which reduces an amount of the hardware, and a method of generating an I/Q signal which reduces an amount of processing for performing the I/Q signal generation.

Additional aspects and advantages of the invention will be set forth in part in the description which follows, and, in part, will be obvious from the description, or may be learned by practice of the invention.

The above and/or other aspects of the present invention are accomplished by an I/Q demodulator comprising first and second multiplexers which generate I and Q signals with respect to an input data signal; first and second decimation units which perform a decimation on the I and Q signals output from the first and second multiplexers, thereby outputting effective I and Q signals; and a filtering unit which filters the effective I and Q signals.

The first and second decimation units may perform a 2-decimation. A delay unit for delaying output of one of I and Q signals received from the first and second multiplexers may also be provided.

According to an embodiment of the present invention, the I/Q demodulator may further comprise first and second upsampling units which upsample the I and Q signals output from the first and second multiplexers; and first and second downsampling units which down sample the filtered I and Q signals.

In another aspect of the present invention, a method of generating an I/Q signal comprises generating I and Q signals with respect to an input data signal; decimating the I and Q signals, thereby outputting effective I and Q signals; and filtering the effective I and Q signals.

The decimating of the I and Q signals may further comprise 2-decimating the I and Q signals. The method may further comprise delaying one of the generated I and Q signals prior to decimating the delayed signal.

An advantage of the present invention is that hardware required for low pass filtering (LPF) is reduced and an operation frequency of the LPF is also reduced.

According to another embodiment of the present invention, an I/Q demodulator comprises first and second decimation units which decimate even-numbered input data signals and odd-numbered input data signals, respectively; first and second multiplexers which generate an I signal of an inphase component and a Q signal of a quadrature component with respect to the decimated even-numbered data signals and the odd-numbered data signals, respectively; and a filtering unit which filters the I and Q signals output from the first and second multipelxers.

Further provided is a delay unit which delays the output of the input data signals for a predetermined time, to separate even-numbered input data signals from the odd-numbered input data signals. First and second decimation units perform a 2-decimation on a respective one of the I and Q signals.

The I/Q demodulator may include first and second upsampling units which upsample the I and Q signals output from the first and second multiplexers; and first and second downsampling units which downsample the filtered I and Q signals.

According to yet another embodiment of the present invention, an I/Q signal generating method comprises: separating an even-numbered input data signal from an odd-numbered input data signal; generating an I signal of inphase component and a Q signal of quadrature component with respect to the separated data signals, respectively; and filtering the I and Q signals, respectively.

Since the input signals are determined according to the characteristic thereof, the first and second multiplexers may be reduced in terms of hardware.

BRIEF DESCRIPTION OF THE DRAWINGS

The above-mentioned objects and features of the present invention will be more apparent by describing in detail embodiments thereof with reference to the accompanying drawings, in which.

DESCRIPTION OF THE PREFERRED EMBODIMENT

Figure 1:
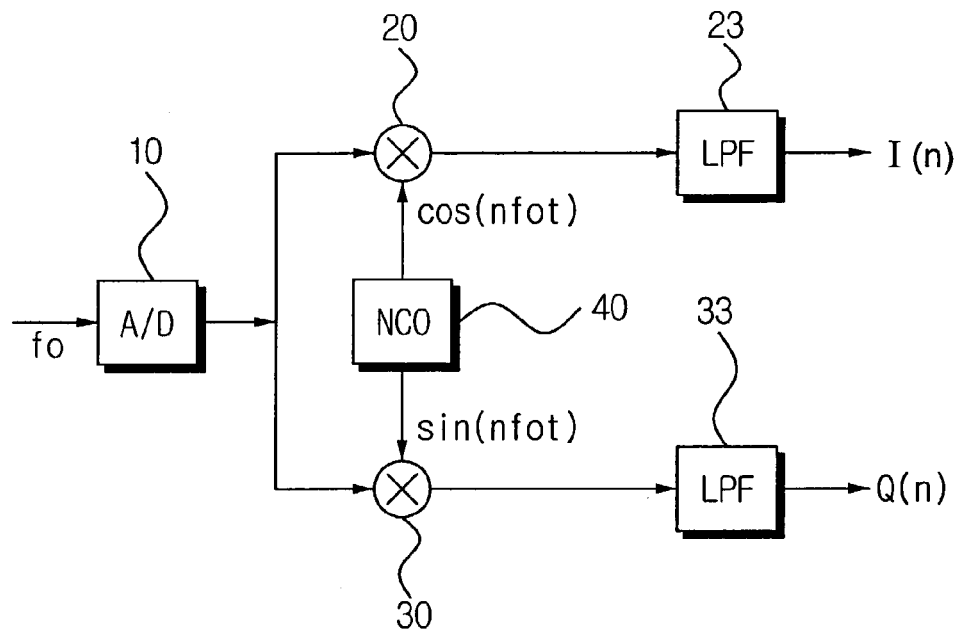
FIG. 1 is a block diagram of a conventional I/Q demodulator which uses a multiplier to separate the I and Q signals.

Reference will now be made in detail to the present embodiments of the present invention, examples of which are illustrated in the accompanying drawings, wherein like reference numerals refer to like elements throughout.

Figure 4A:
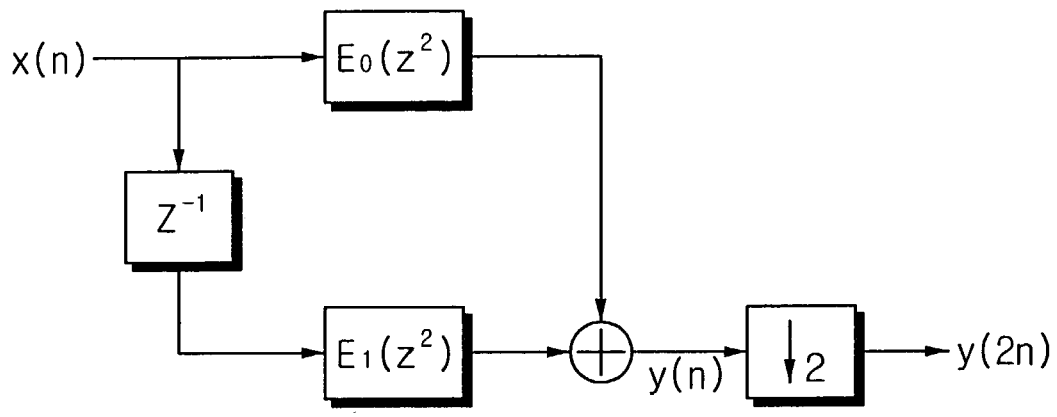
FIG. 4A is a view for explaining a 'poly phase decomposition' approach to generating I/Q signals.
Figure 4B:
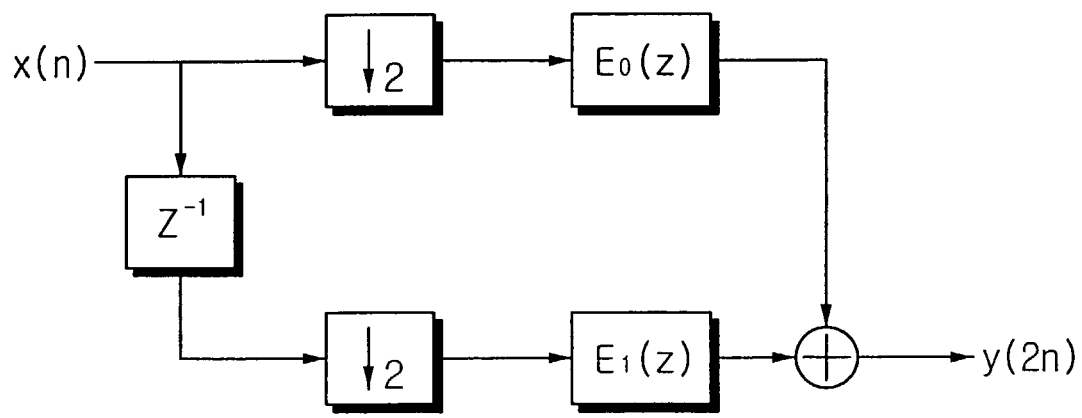
FIG. 4B is another view for explaining the 'poly phase decomposition' approach to generating I/Q signals.

FIGS. 4A and 4B are views for explaining a 'poly phase decomposition' approach to generating I/Q signals, which is disclosed in "Multirate Digital Filters, Filter Banks, Polyphase Networks, and Applications: A Tutorial," IEEE, vol. 78, No. 1, January 1990. The following is a brief description thereof.

First, impulse response H(z) of the LPF is defined by Equation 6:

$$H(z) = \sum_{k=0}^{M-1} z^{-k} E_k(z^M) \quad (6)$$

Where M=2, Equation 7 may be used.

$$H(z) = E_0(z^2) + z^{-1} E_1(z^2) \quad (7)$$

As shown in Equation 7, H(z) is divided into $E_0(z^2)$ and $z^{-1}E_1(z^2)$.

As shown in FIG. 4A, signal y(n) is output with respect to the input signal x(n), and the signal y(2n) is output with respect to even-numbered input signals by the 2-decimation unit.

If the 2-decimation unit of FIG. 4A is positioned as shown in FIG. 4B, $E_0(z^2)$ and $E_1(z^2)$ are changed to $E_0(z)$ and $E_1(z)$. Accordingly, the same output signal as that of FIG. 4A, i.e., y(2n) is obtained with respect to the input signal x(n).

Figure 5:
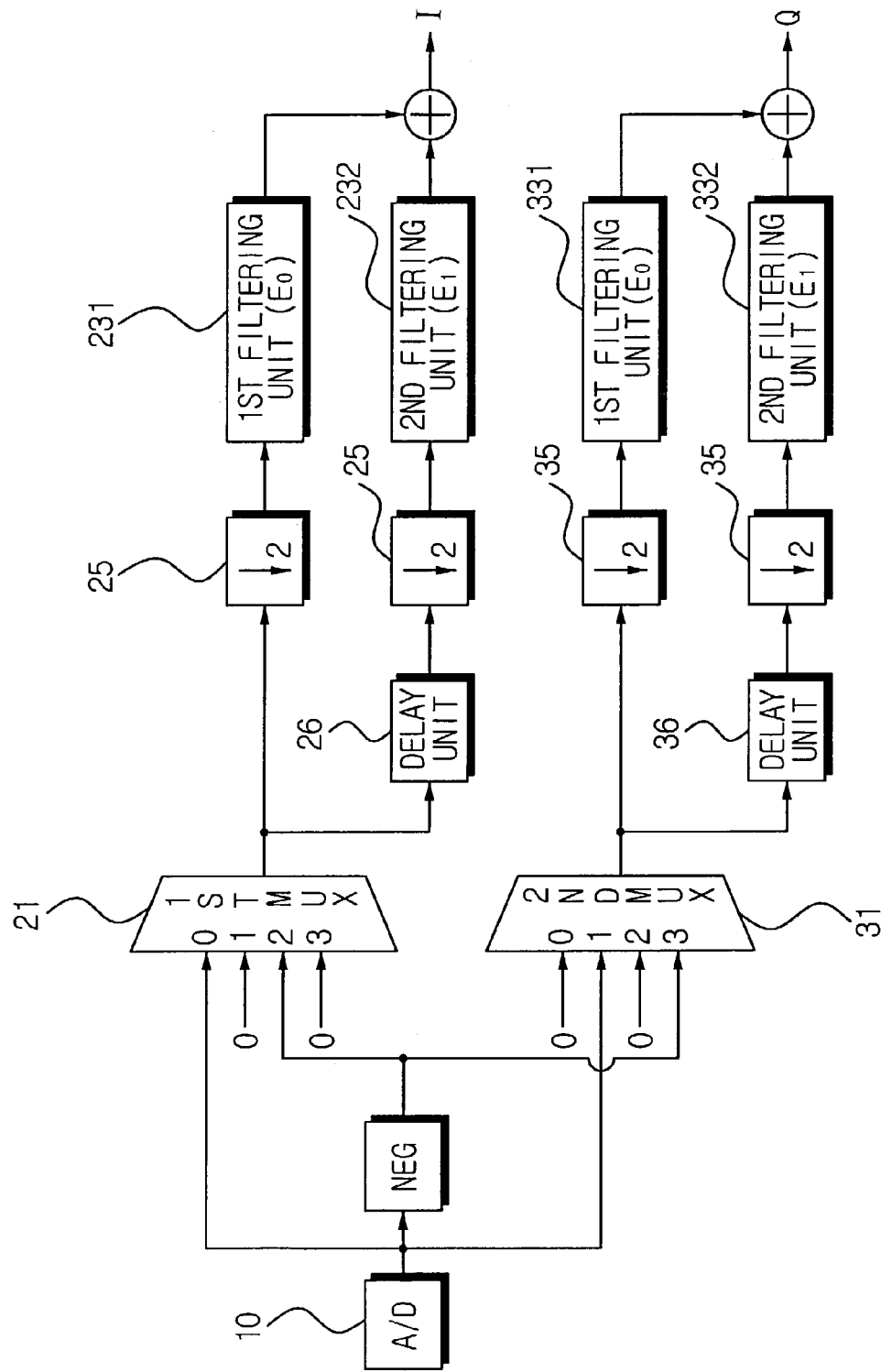
FIG. 5 is a block diagram of an I/Q demodulator applied with the approach illustrated in FIGS. 4A and 4B.

FIG. 5 is a view showing an I/Q demodulator incorporating the 'poly phase decomposition' approach identified above. According to the 'poly phase decomposition' approach, a 2-decimation unit 25 is positioned in front of LPFs 231 and 233, and a 2-decimation unit 35 is positioned in front of each of LPFs 331 and 332.

An input signal is digitalized by the A/D converter 10, input to the first and second multiplexers 21 and 31, multiplied by sin and cos, and thus, I and Q signals are generated. For example, with respect to the data signals of data (0), data (1), data (2), data (3), . . . being sequentially input to the first and second multiplexers 21 and 31, an I signal of data (0), 0, -data (2), 0, . . . , is output from the first multiplexer 21.

The cos-data signals of data (0), 0, -data (2), 0, . . . , that are output from the first multiplexer 21 are input to first and second filtering units 231 and 232.

The input data signals are 2-decimated by the 2-decimation units 25, and as a result, only data '0' is input to the first filtering unit 231. Meanwhile, the input data signals being provided to the second filtering unit 232 are delayed by a delay unit 26 to data signals of 0, -data (2), 0, data (4), . . . , and then 2-decimated by the 2-decimation unit 25, and as a result, data signals of -data (2), data (4), . . . , are input to the second filtering unit 232. As only the '0' data is input to the first filtering unit, an I signal is obtained by selecting the second filtering unit 232, i.e., adding data signals from the second filtering unit 232.

The Q signals are generated in same manner as described above. That is, sin-data signals of 0, data (1), 0, -data (3), . . . from the second multiplexer 31 are input to first and second filtering units 331 and 332.

Input data are 2-decimated by the 2-decimation unit 35 into data (1), -data (3), data (5), . . . and input to the first filtering unit 331. The input signals are delayed by the delay unit 36 into data (1), 0, -data (3), 0, . . . , 2-decimated by the 2-decimation unit 35, and thus, data signals of '0' are input to the second filtering unit 332. As only data signals of '0' are input to the second filtering unit 332, Q signals are obtainable by selecting the first filtering unit 331, i.e., adding the data signals from the first filtering unit 331.

Figure 6:
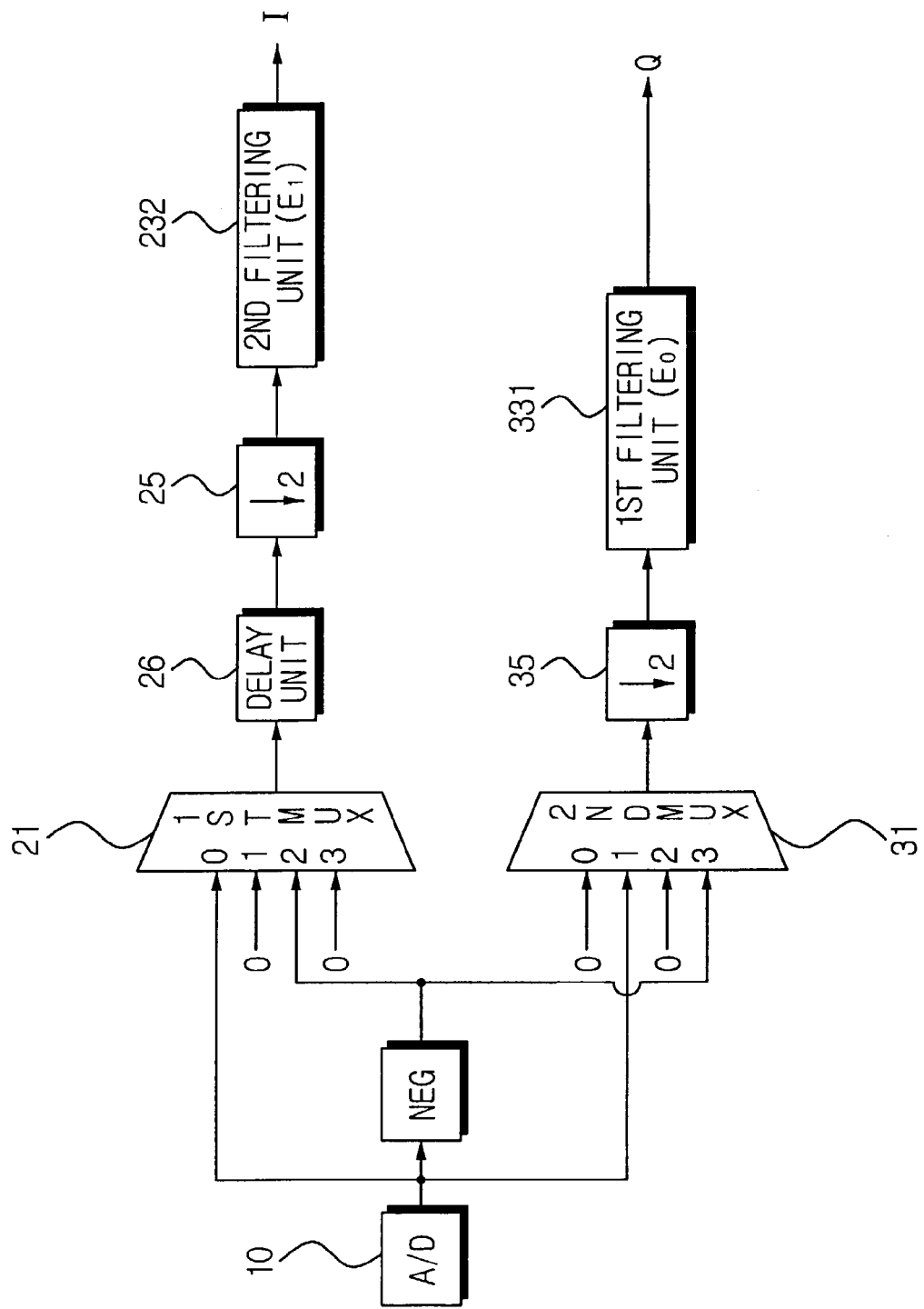
FIG. 6 is a block diagram showing an I/Q demodulator according to a first embodiment of the present invention.

An embodiment of the I/Q demodulator according to the present invention is shown in FIG. 6. The I/Q demodulator shown in FIG. 6 comprises an I signal generating unit further comprising a first multiplexer 21, a delay unit 26, a 2-decimation unit 25 and a second filtering unit 232; and a Q signal generating unit further comprising a second multiplexer 32, a 2-decimation unit 35, and a first filtering unit 331.

Figure 7:
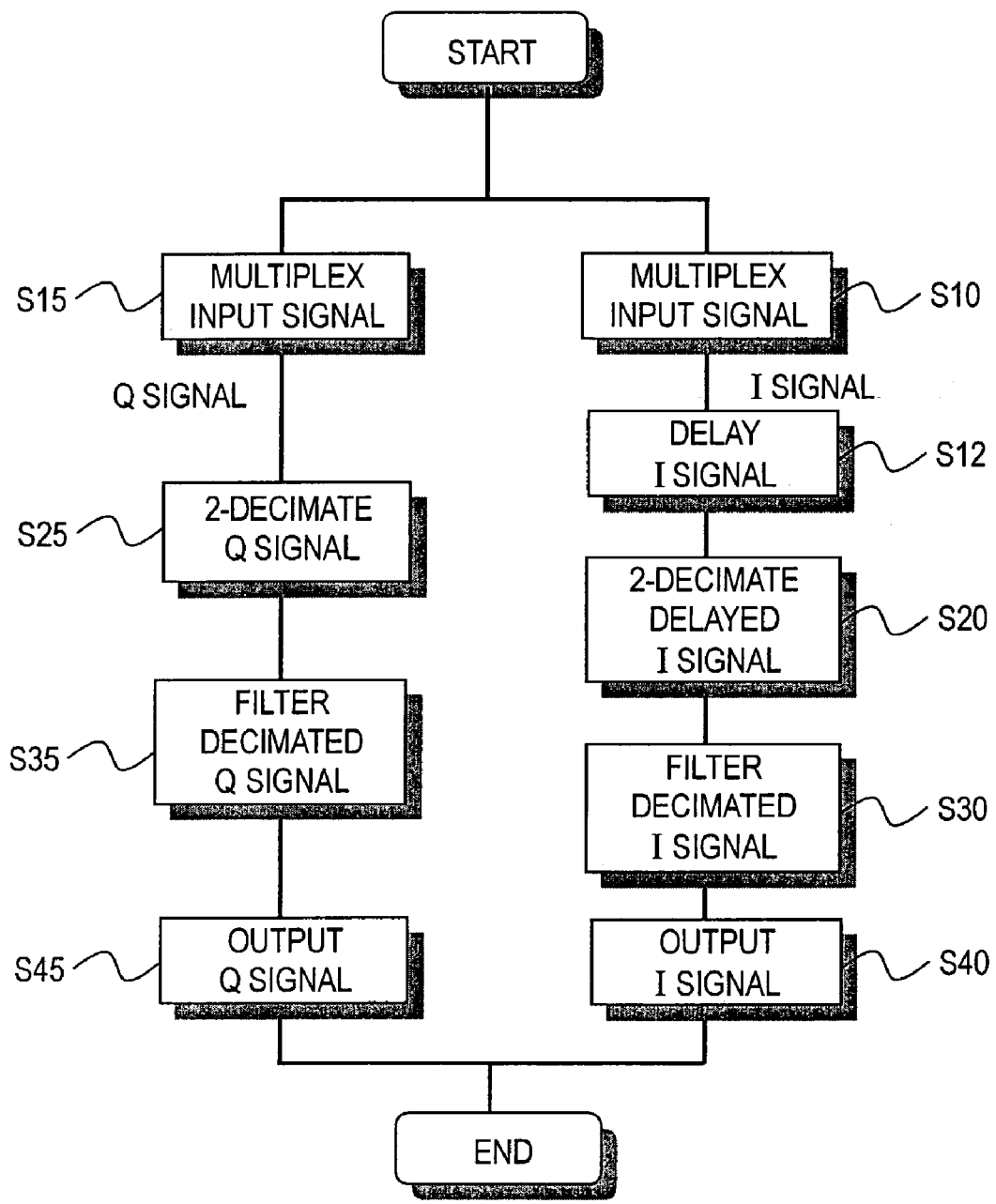
FIG. 7 is a flowchart showing a method of generating I/Q signals using the I/Q demodulator shown in FIG. 6.

As described, only one of the first filtering units 231 and 331 and only one the second filtering units 232 and 332 which were used in the conventional demodulator shown in FIG. 5 are required for generating I and Q signals. Accordingly, the I/Q demodulator is realizable with a reduced number of hardware components. The I/Q signal generating method using the embodiment shown in FIG. 6 will be described with reference to FIGS. 6 and 7.

First, data signals digitalized by the A/D converter 10 are input to the I/Q demodulator. The first multiplexer 21 multiplies the input data signal by cos, and thereby outputs the I signal. Further, the second multiplexer 31 multiplies the input data signals by sin, and thereby outputs the Q signal.

The I signal component output from the first multiplexer 21 at operation S10 is delayed by the delay unit 26 for a predetermined time at operation S12, 2-decimated by the 2-decimation unit 25 at operation S20, and the 2-decimated I signal is filtered by the second filtering unit 232 at operation S30, thus data (2), data (4), -data (6), . . . (as described above with reference to FIG. 5) are output at operation S40.

Meanwhile, the Q signal component output from the second multiplexer 31 at operation S15 is 2-decimated by the 2-decimation unit 35 at operation S25 and the 2-decimated Q signal is filtered by the first filtering unit 331 at operation S35, and thus data (1), -data (3), data (5), . . . (as described above with reference to FIG. 5) are output at operation S45.

Accordingly, the first filtering unit 231 for processing the I signal and the second filtering unit 332 for processing the Q signal become unnecessary, and thus the LPFs are reduced by half in size in terms of the hardware design. For example, a 16 tap filter will carry out the same performance as a 32 tap filter.

Further, since an operation frequency of the LPF may be reduced by half, power consumption is also reducible.

Figure 8:
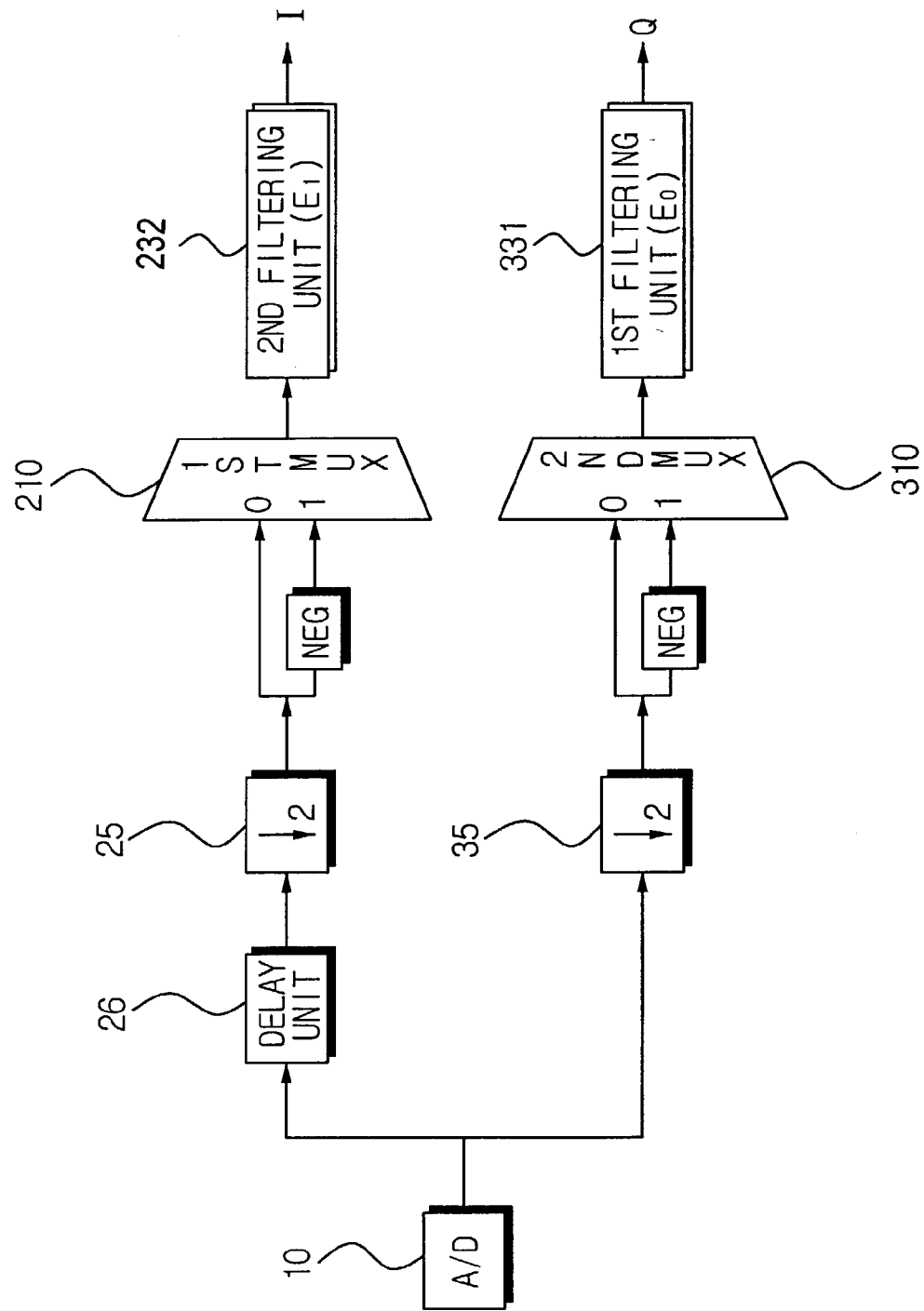
FIG. 8 is a block diagram showing an I/Q demodulator according to a second embodiment of the of the present invention.

FIG. 8 shows an I/Q demodulator according to a second embodiment of the present invention, in which a delay unit 26 and a 2-decimation unit 25 is positioned in front of a first multiplexer 210, a 2-decimation unit 35 is positioned in front of a second multiplexer 310, and the input signals are simultaneously input to the second filtering unit 232 and the first filtering unit 331.

The I signal generating parts include the delay unit 26, the 2-decimation unit 25, the first multiplexer 210 and the second filtering unit 232; and the Q signal generating parts include the 2-decimation unit 35, the second multiplexer 310 and the first filtering unit 331.

Figure 9:
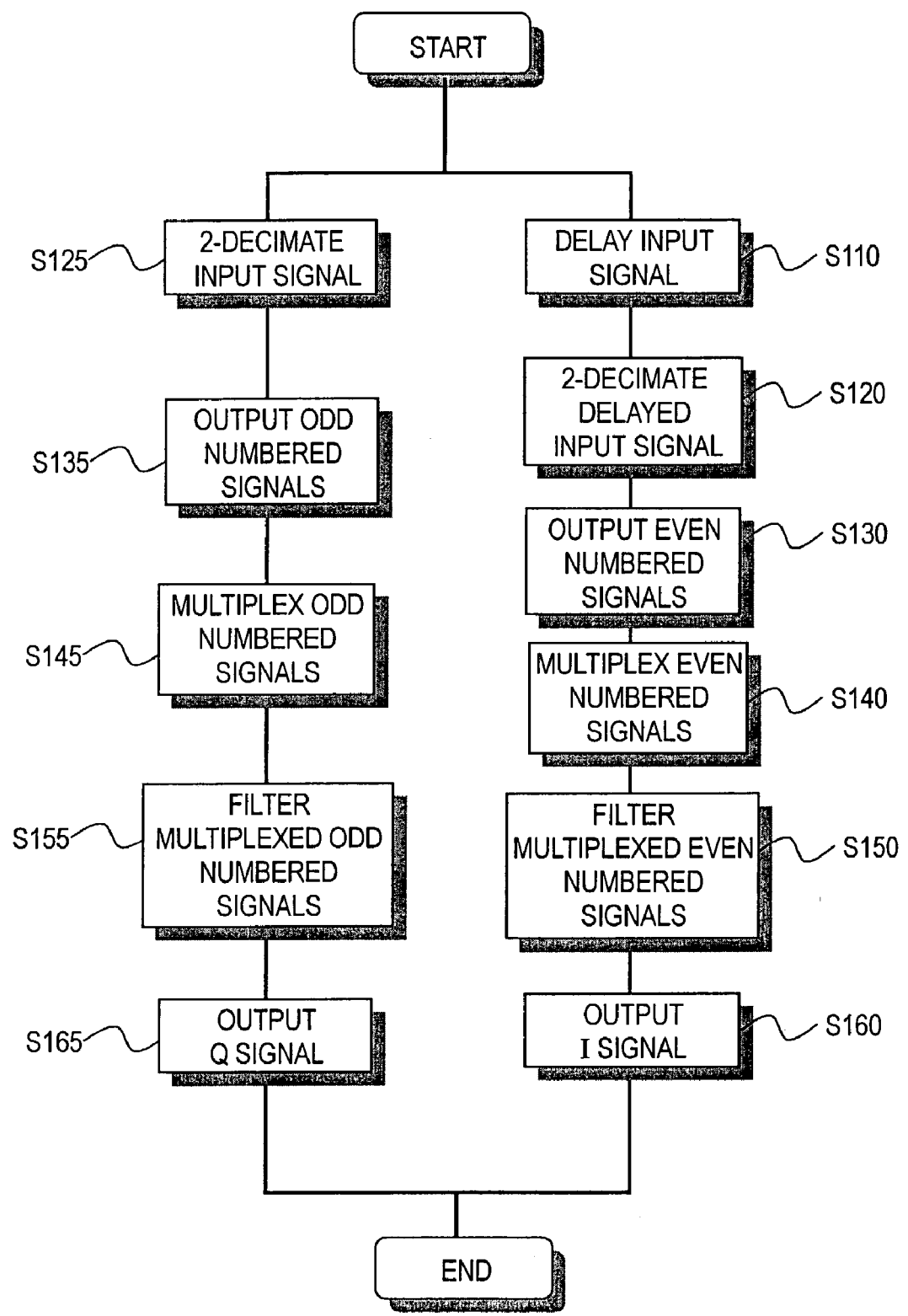
FIG. 9 is a flowchart showing a method for generating I/Q signals using the I/Q demodulator shown in FIG. 8.

The method of generating I/Q signals using the second embodiment shown in FIG. 8 will be described with reference to FIG. 9.

Digitalized data signals of data (0), data (1), data (2), data (3), . . . , are output from the A/D converter 10 and input to the I/Q demodulator shown in FIG. 8. The input signal is delayed by the delay unit 25 at operation S110 and the delayed input signal is 2-decimated by the 2-decimation unit25 at operation S120. The undelayed input signal is 2-decimated by the 2-decimation unit 35 at operation S125, resulting in even-numbered input data signals of data (2), data (4), data (6) and odd-numbered input data signals of data (1), data (3), data (5), . . . being output from the 2-decimation units 25 and 35 at operations S130 and S135, respectively.

In other words, the even numbered signals output from the 2 decimation unit 25 at operation S130 correspond to the I signals and the odd-numbered input data signals output from the 2-decimation unit 35 at operation S135 correspond to the Q signals.

Accordingly, first and second multiplexers 210, 310 multiply 1, −1, . . . , to thereby generate I and Q signals, at operation S140 and S145, respectively.

The I and Q signals from first and second multiplexers 210 and 310 are low pass filtered by first and second filtering units 232 and 331, respectively, at operations S155 and 150, respectively and the I and Q signals are output at operations S160 and S165, respectively.

In the second embodiment, the first and second multiplexers 210 and 310 need only two inputs (0, 1) as compared with four inputs (0, 1, 2, 3) which are required by the (Instead of) first and second multiplexers 21 and 31 which are used in the first embodiment shown in FIG. 6. Thus, the multiplexers in the second embodiment are simplified, reducing a size of hardware of each multiplexer by half. The hardware required of the low pass filters is also reduced by half (compared with the conventional demodulator) in a similar manner as in the first embodiment.

Since the hardware of the low pass filters and the multiplexers is reduced by half, an operational frequency of the low pass filters and the multiplexers is reduced by half. As a result, power consumption is reduced.

Figure 3A:
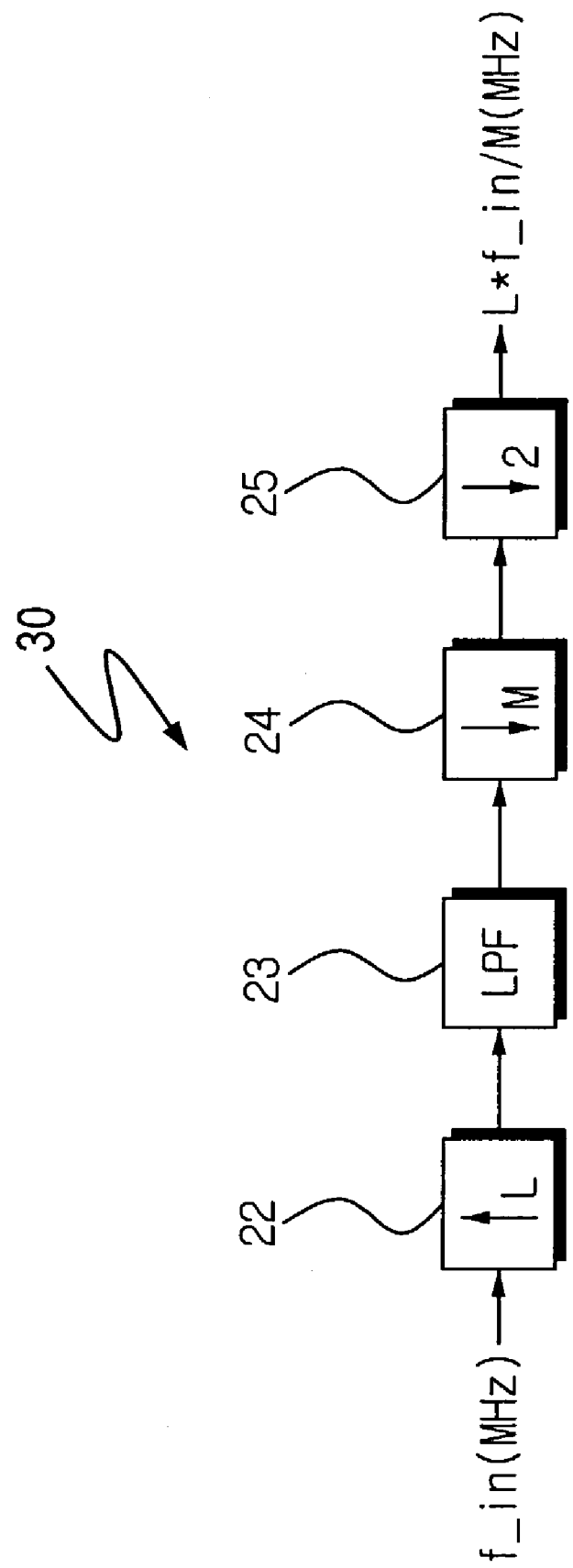
FIG. 3A is a block diagram of a resampling unit of a conventional I/Q demodulator.
Figure 3B:
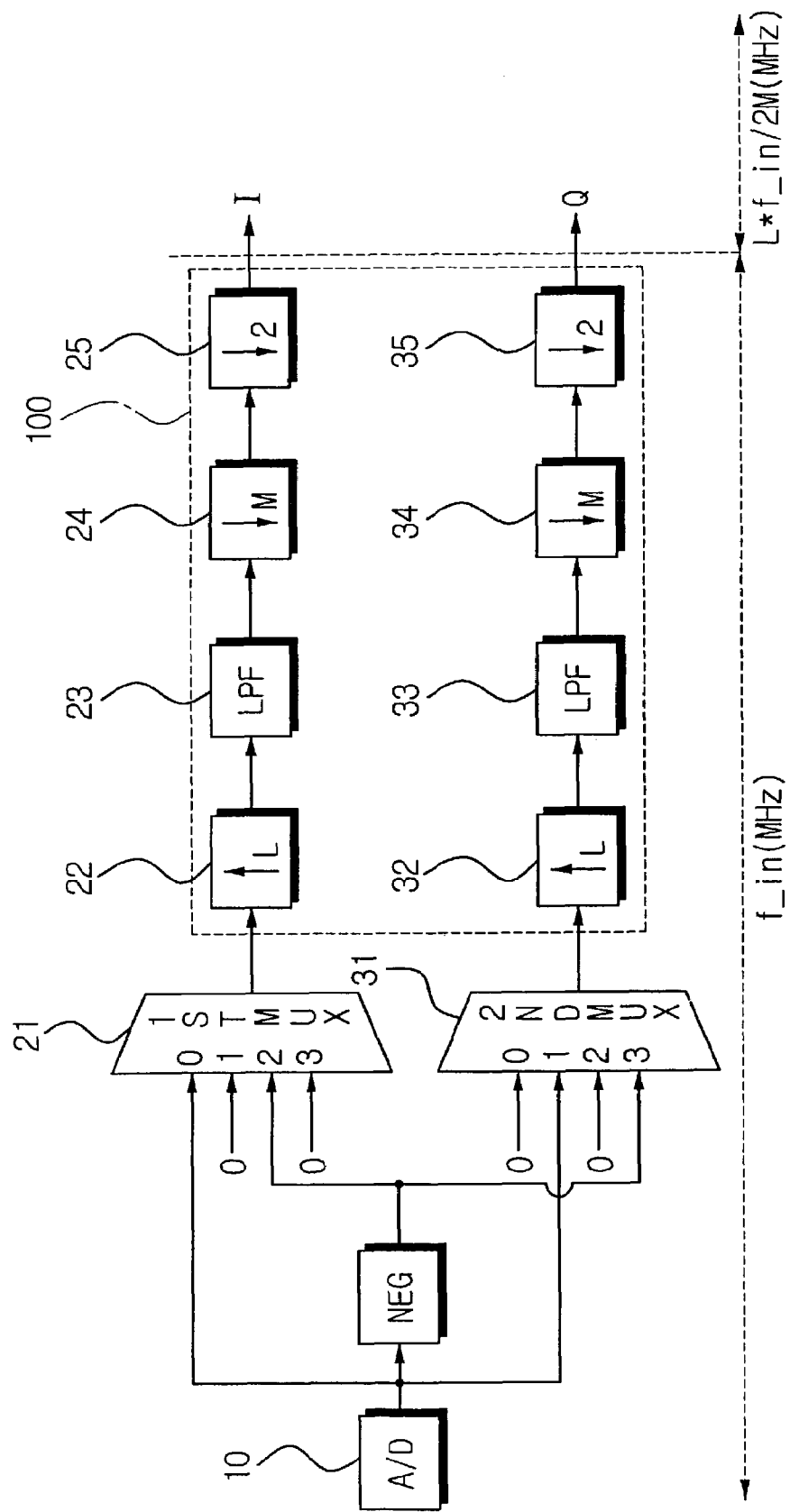
FIG. 3B is a block diagram of the conventional I/Q demodulator incorporating the resampling unit of FIG. 2.

The I/Q demodulators according to a third and a fourth embodiments of the present invention are based on applying the 'poly phase decomposition' approach illustrated in FIGS. 4A and 4B to the resampling unit 100 shown in FIG. 3B, in order to reduce a design complexity of the low pass filters and the multiplexers.

Figure 10:
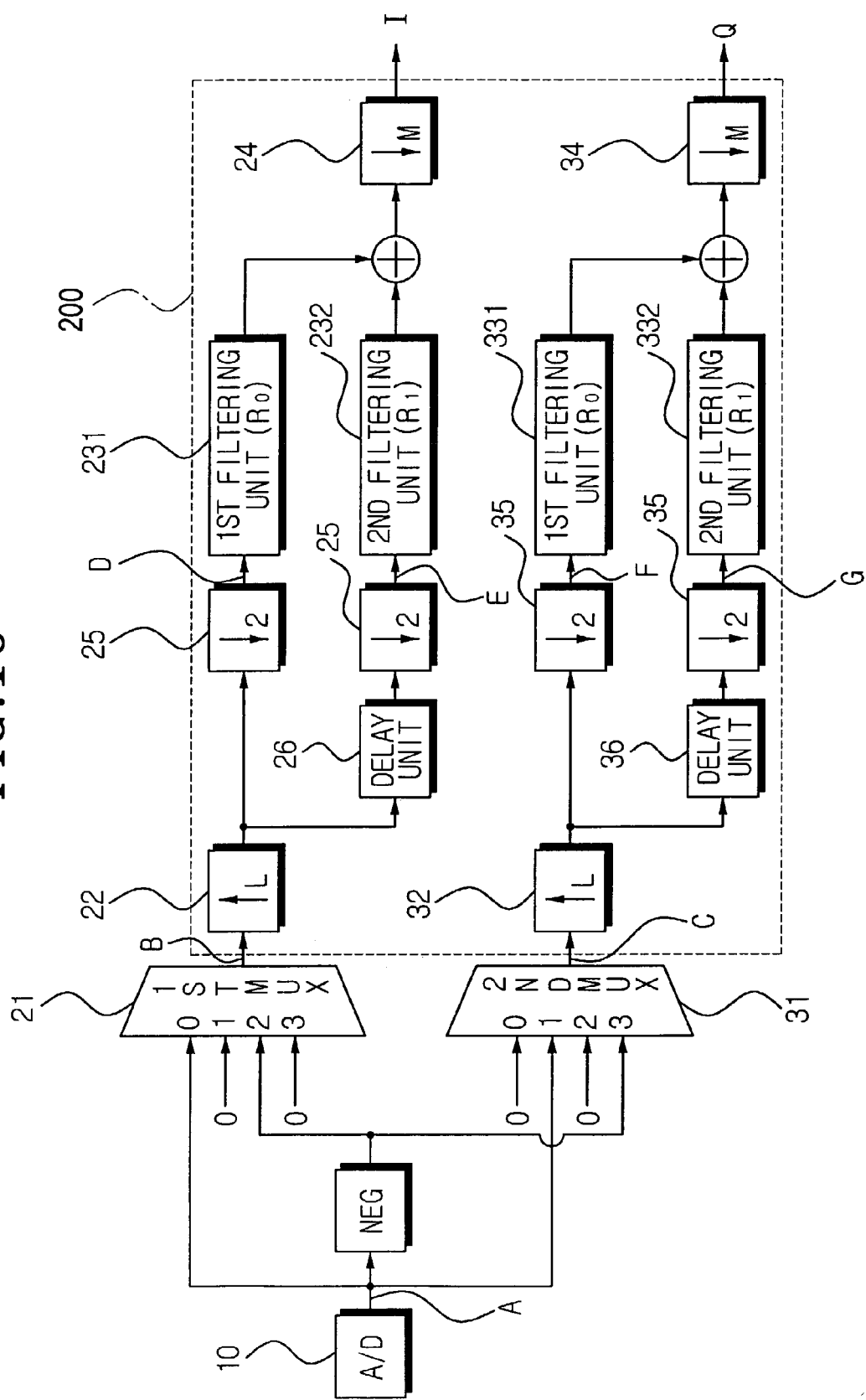
FIG. 10 is a block diagram showing an I/Q demodulator having the resampling unit thereof constructed according to the approach illustrated in FIGS. 4A and 4B.

In the third embodiment, as shown in FIG. 10, an input signal, digitalized by the A/D converter 10, is input to first and second multiplexers 21 and 31, respectively, to generate I and Q signals.

Stream of data signals from output end A of the A/D converter 10, and from output ends B and C of the first and second multiplexers 21 and 31, respectively, are as shown in Table 1.

TABLE 1

| | | Time | | | | | | | | | |
|---|---|---|---|---|---|---|---|---|---|---|---|
| | 0 | T | 2T | 3T | 4T | 5T | 6T | 7T | 8T | 9T | 10T |
| A | d(0) | d(1) | d(2) | d(3) | d(4) | d(5) | d(6) | d(7) | d(8) | d(9) | d(10) |
| B | d(0) | 0 | −d(2) | 0 | d(4) | 0 | −d(6) | 0 | d(8) | 0 | −d(10) |
| C | 0 | d(1) | 0 | −d(3) | 0 | d(5) | 0 | −d(7) | 0 | d(9) | 0 |

Accordingly, the first multiplexer 21 outputs I-signal (sin value) components, while the second multiplexer 31 outputs Q-signal (cos value) components.

The I and Q signal components are input to a resampling unit 200, and generated into I and Q signals by passing through the L-upsampling units 22 and 32, being 2-decimated and filtered and passing through M-down sampling units 24 and 34, respectively.

Depending on whether the L of the L-upsampling units 22 and 32 is of even numbers or odd numbers, the first and second filtering units 231 and 232 and the first and second filtering units 331 and 332 are selectively used for I and Q signals.

Where the L of the L-upsampling unit 22 is an even number, the output signal B from the first multiplexer is input to input ends D and E of the first and second filtering units 231 and 232 as shown in Table 2:

TABLE 2

| | | Time | | | | | | | |
|---|---|---|---|---|---|---|---|---|---|
| | T/L | ~ | 2T + (T/L) | ~ | 4T + (T/L) | ~ | 6T + (T/L) | ~ | 8T + (T/L) |
| D | 0 | 0(L-1) | 0 | 0(L-1) | 0 | 0(L-1) | 0 | 0(L-1) | 0 |
| E | d(0) | 0(L-1) | −d(2) | 0(L-1) | d(4) | 0(L-1) | −d(6) | 0(L-1) | d(8) |

As shown in Table 2, data signals of '0' are input to the first filtering unit 231 with respect to the data signals output from the first multiplexer 21. Accordingly, in order to generate the I signal, the second filtering unit 232 alone may be selected. In Table 2, a time interval is 2 T/L.

Meanwhile, output signals C from the second multiplexer 31 are input into input ends F, G of first and second filtering units 331 and 332, respectively, as shown in Table 3.

TABLE 3

| | | | | Time | | | | | |
|---|---|---|---|---|---|---|---|---|---|
| | ~ | T + (T/L) | ~ | 3T + (T/L) | ~ | 5T + (T/L) | ~ | 7T + (T/L) | ~ |
| F | 0(L/2) | 0 | 0(L−1) | 0 | 0(L−1) | 0 | 0(L−1) | 0 | 0(L−1) |
| G | 0(L/2) | d(0) | 0(L−1) | −d(3) | 0(L−1) | d(5) | 0(L−1) | −d(7) | 0(L−1) |

As shown in the Table 3, only the data signals of '0' are input to the first filtering unit 331 with respect to the data signals output from the second multiplexer 31. Accordingly, the second filtering unit 332 alone may be selected for generating the Q signals. In Table 3, a time interval is 2 T/L.

In other words, where the L is the even number, the second filtering units 232 and 332 may be selected for generating the I and Q signals, respectively.

When the L of the L-upsampling units 22 and 32 is an odd number, output signals B from the first multiplexer 21 are input to input ends D and E of first and second filtering units 231 and 232, respectively, as shown in Table 4:

TABLE 4

| | | | | Time | | | | | |
|---|---|---|---|---|---|---|---|---|---|
| | T/L | ~ | 2T + (T/L) | ~ | 4T + (T/L) | ~ | 6T + (T/L) | ~ | 8T − (T/L) |
| D | 0 | 0(L−1) | 0 | 0(L−1) | 0 | 0(L−1) | 0 | 0(L−1) | 0 |
| E | d(0) | 0(L−1) | −d(2) | 0(L−1) | d(4) | 0(L−1) | −d(6) | 0(L−1) | d(8) |

As shown in the Table 4, only the data signals of '0' are input to the first filtering unit 231 with respect to the data signals output from the first multiplexer 21. Accordingly, the second filtering unit 232 alone may be selected for generating the I signals. In Table 4, a time interval is 2 T/L.

Meanwhile, output signals C from the second multiplexer 31 are input to input ends F and G of the first and second filtering units 331 and 332, respectively, as shown in Table 5.

TABLE 5

| | | | | Time | | | | | |
|---|---|---|---|---|---|---|---|---|---|
| | ~ | T + (T/L) | ~ | 3T + (T/L) | ~ | 5T + (T/L) | ~ | 7T + (T/L) | ~ |
| F | 0(L−1)/2 | d(1) | 0(L−1) | −d(3) | 0(L−1) | d(5) | 0(L−1) | −d(7) | 0(L−1) |
| G | 0(L−1)/2 | 0 | 0(L−1) | 0 | 0(L−1) | 0 | 0(L−1) | 0 | 0(L−1) |

As shown in the Table 5, only the data signals of '0' are input to the second filtering unit 332 with respect to the data signals output from the second multiplexer 31. Accordingly, the first filtering unit 331 alone may be selected for generating the Q signals. In Table 5, a time interval is 2 T/L.

Where the L is the odd number, the first and second filtering units 331, 232 may be selectively used for the I and Q signals.

Accordingly, a necessary one among the first and second filtering units 231 and 232, and a necessary one of the first and second filtering units 331 and 332 may be selected and provided for generating I and Q signals according to whether the L of the corresponding L-sampling units 22 or 32 is odd or even.

Figure 11A:
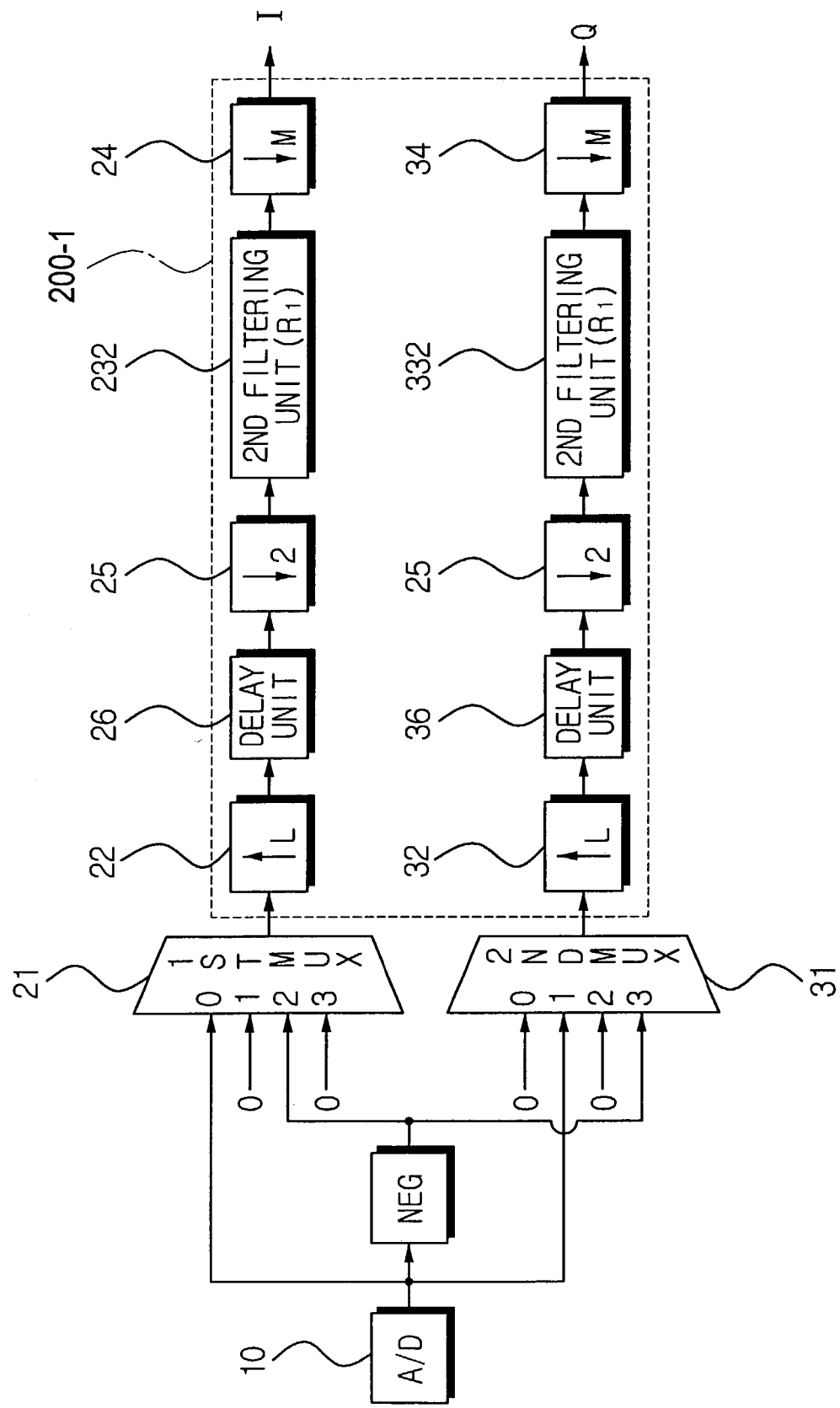
FIG. 11A is a block diagram showing a third embodiment of the I/Q demodulator of the present invention.
Figure 11B:
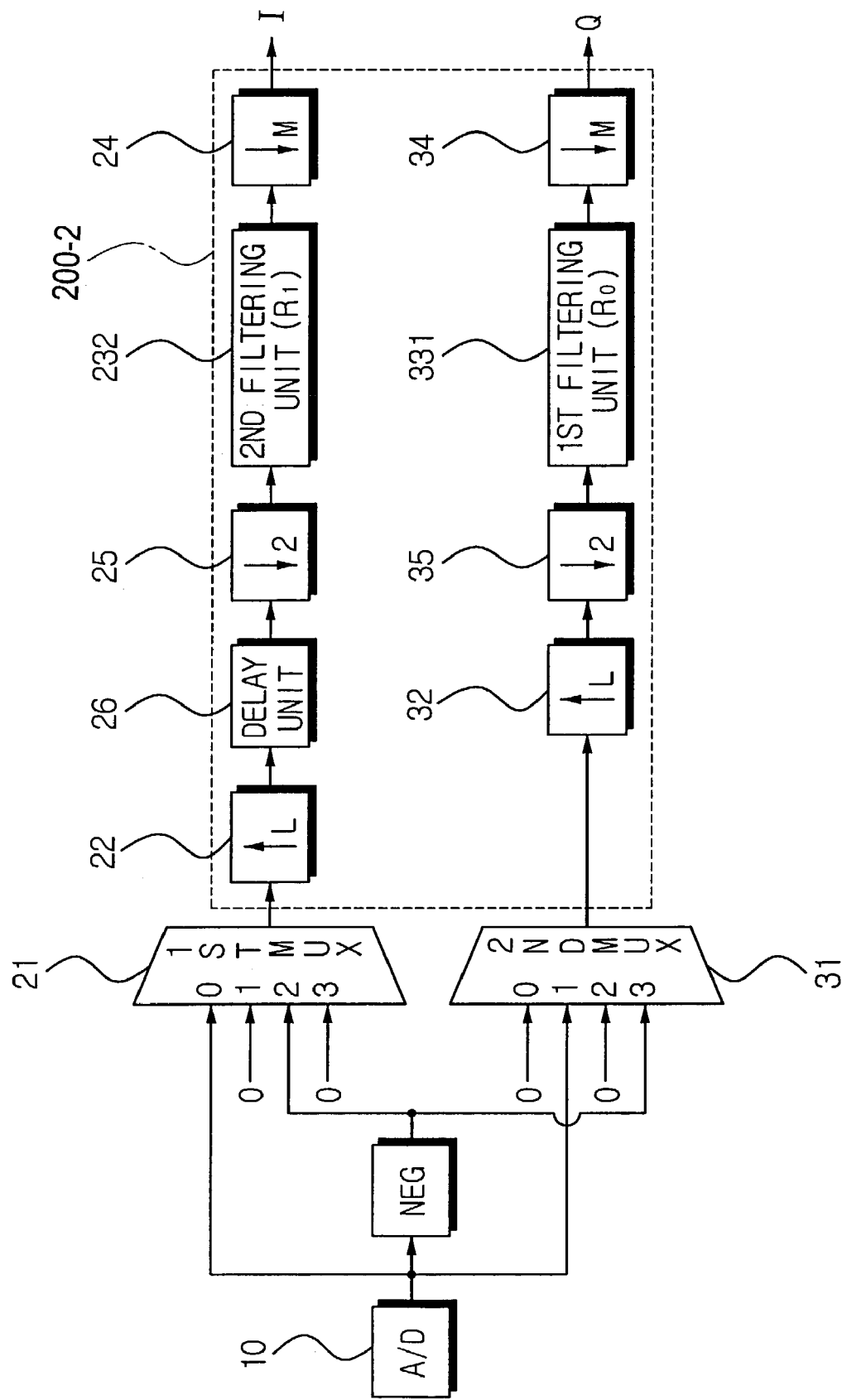
FIG. 11B is a block diagram of a fourth embodiment of the I/Q demodulator of the present invention.

FIGS. 11A and 11B show third and fourth embodiments of the present invention, in which a reduced type of LPF is provided for the cases where the L of the upsampling unit of the resampling unit 100 is an even number and an odd number. Where the L of the L-upsampling units is even, the resampling unit 200 shown is FIG. 10 may be reduced in complexity to the resampling unit 200-1 as shown in FIG. 11A. Where the L of the L-upsampling units 22 and 32 is odd, the resampling unit 200 shown in FIG. 10 may be reduced in complexity to the resampling unit 200-2 as shown in FIG. 11B.

Figure 12A:
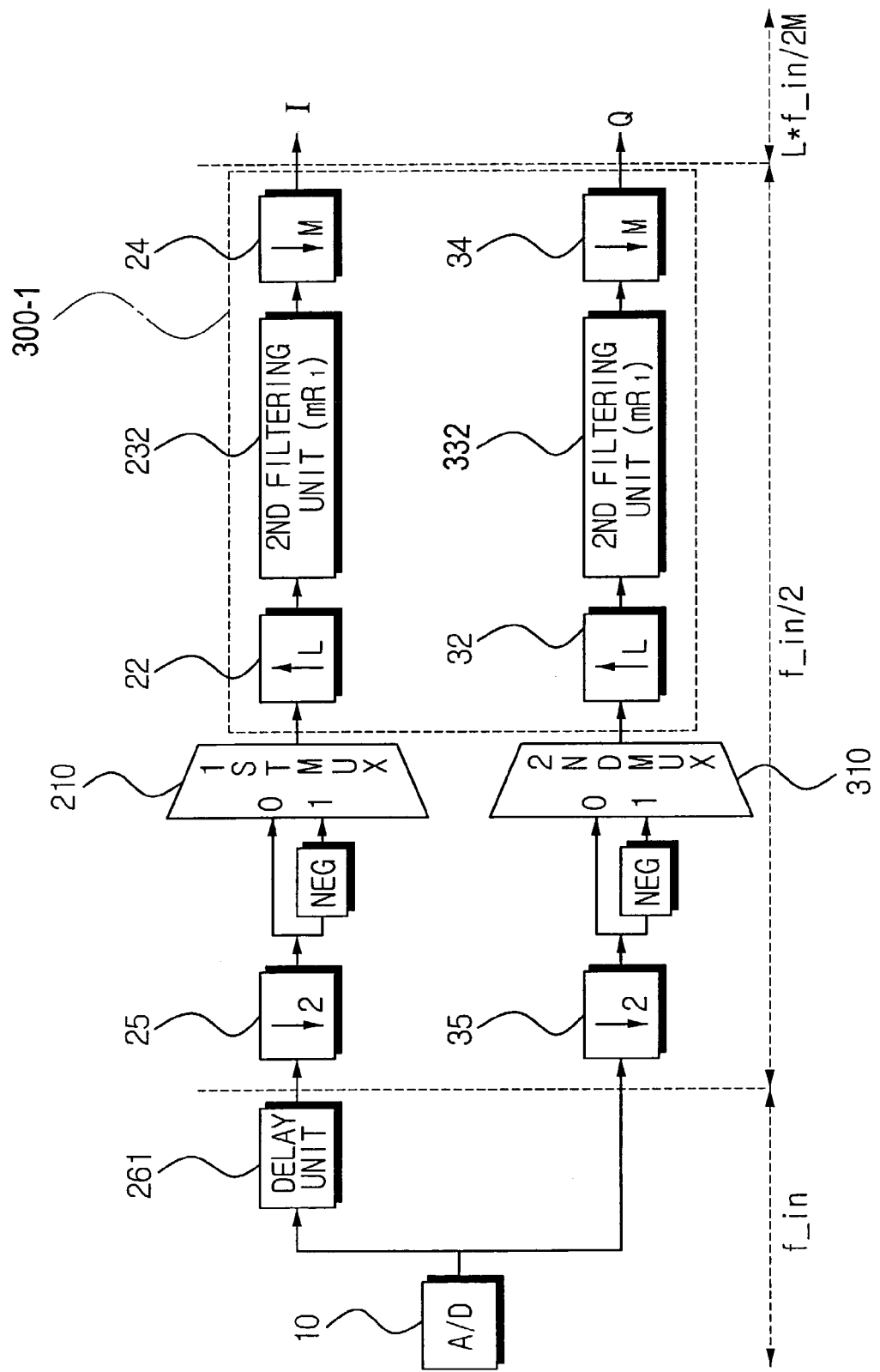
FIG. 12A is a block diagram showing a fifth embodiment of the I/Q demodulator of present invention.
Figure 12B:
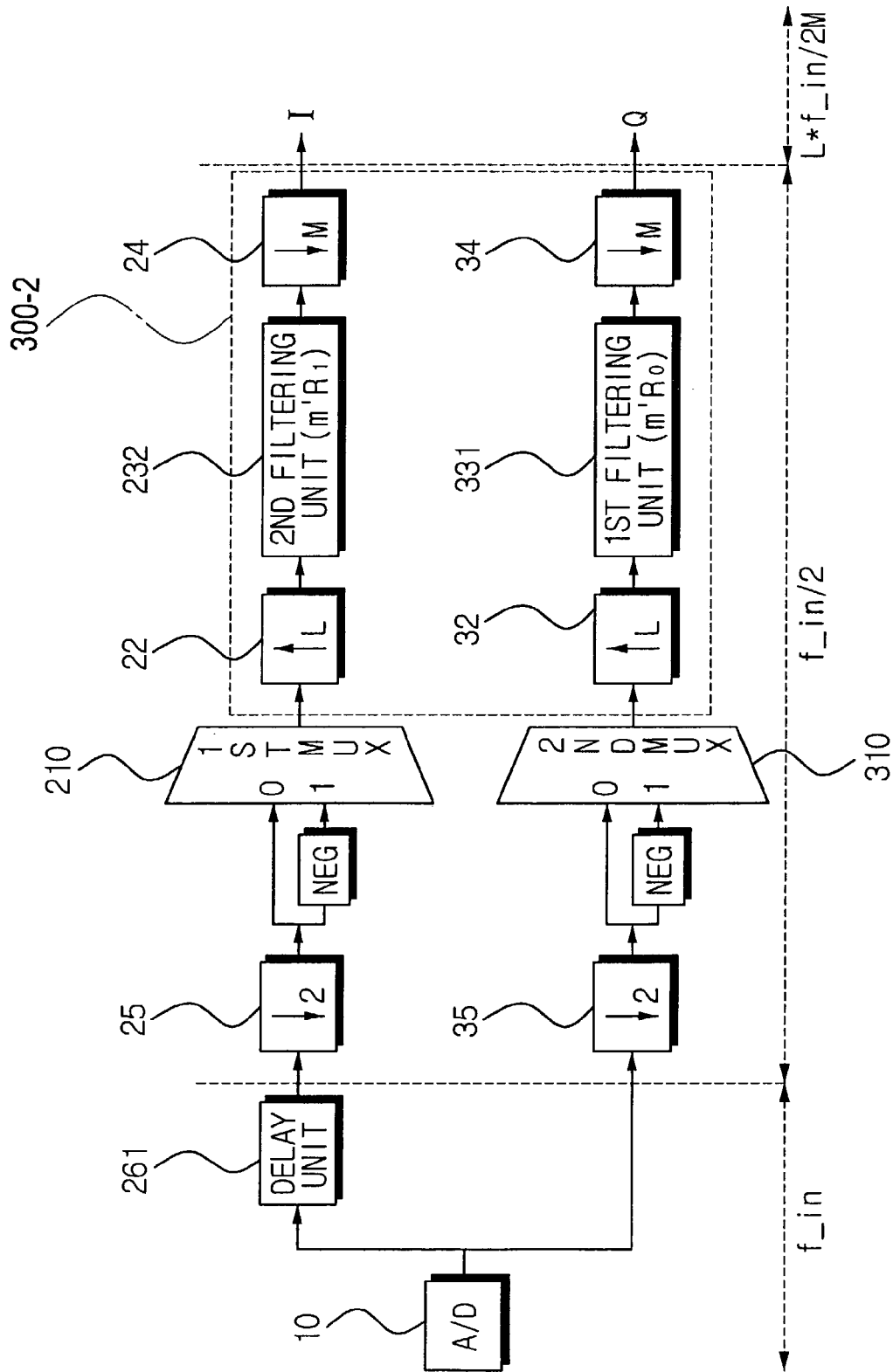
FIG. 12B is a block diagram showing a sixth embodiment of the I/Q demodulator of present invention.

FIGS. 12A and 12B show fifth and sixth embodiments of the present invention, in which the I/Q demodulator has 2-decimation units 25 and 35 which are provided in front of first and second multiplexers 210 and 310, respectively.

FIG. 12A shows the case where the L is an even number. As shown in the Table 2, the stream E of data signals input to the second filtering unit 232 for generating I signals is comprised of data(0), 0(L−1), −data(2), 0(L−1), data(4), 0(L3), −data(6), 0(L−1), and data(8) while as shown in Table 3, the stream of data signals input to the second filtering unit 332 for generating the Q signals is comprised of 0(L/2), data(0), 0(L−1), -data(3), 0(L−1), data (5), 0(L−1), -data(7), 0(L−1), . . . .

Accordingly, for a simultaneous input of data signals to the respective filtering units 232 and 332, the input of the signal to the second filtering unit 332 must be L/2 earlier than the signal being input to the second filtering unit 232. To make such a time difference in the input of data signals, a delay unit may be separately provided, or coefficients $mR_1$ of the filtering units 232 and 332, respectively, may be adjusted.

FIG. 12B shows the case where the L is an odd number. As shown in the Table 4, the stream E of data signals input to the second filtering unit 232 generating I signals is comprised of data(0), 0(L−1), -data(2), 0(L−1), data(4), 0(L−1), -data(6), 0(L−1), data(8), . . . , while, as shown in Table 5, the stream F of data signals input to the first filtering unit 331 generating Q signals is comprised of 0((L−1)/2), data(1), 0(L−1), -data(3), 0(L−1), data(5), 0(L−1), -data(7), 0(L−1), . . . .

Accordingly, for a simultaneous input of the data signals into the respective filtering units 232 and 331, the input of signal to the second filtering unit 232 must be (L−1)/2 earlier than the signal being input to the first filtering unit 331.

For a time difference in the input of signals, a delay unit may be separately provided, or as shown in FIG. 12B, coefficients $m'R_1$ and $m'R_0$ of the filtering units 232 and 331, respectively may be adjusted.

Figure 2:
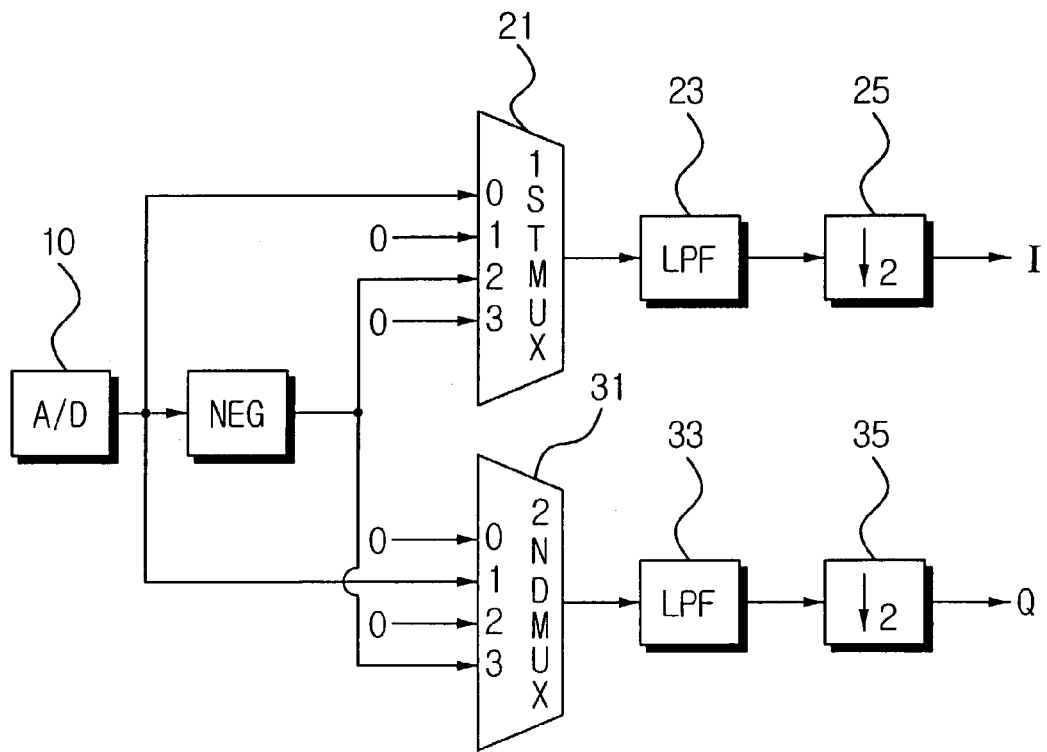
FIG. 2 is a block diagram of a conventional I/Q demodulator which uses a multiplexer to separate the I and Q signals.

As shown in FIGS. 12A and 12B, 2-decimation units 25 and 35 are provided in front of the first and second multiplexers 210 and 310, respectively, and a delay unit 261 is provided for separating the input data signals into I and Q signal components.

For generating I signals, delayed data of data(1), data(2), data(3), . . . , which are delayed by the delay unit 261 from the incoming stream of data signals of data(0), data(1), data(2), data(3), . . . , are input to the 2-decimation unit 25. After the 2-decimation by the 2-decimation unit 25, even-numbered input data signals of data(2), data(4), data(6), . . . , are output.

With respect to Q signals, odd-numbered input data signals of data(1), data(3), data(5), . . . are output after the 2-decimation by the 2-decimation unit 35.

Data signals from the 2-decimation units 25 and 35 are separated according to the characteristics of I and Q signals, and input to first and second multiplexers 210 and 310, respectively.

Next, through the multiplication by 1, −1, . . . by first and second multiplexers 210 and 310, I and Q signals are generated.

First and second multiplexers 210 and 310 may be designed to have two inputs. That is, the first and second multiplexers 210 and 310 may be designed to have a reduced number of inputs as compared with four inputs of the first and second multiplexers 21 and 31 of the third embodiment as shown in FIGS. 11A and 11B.

The I and Q signal components from the first and second multiplexers 210 and 310 are input to the resampling unit 300-1 or 300-2.

As described above, the resampling unit 300-1 or 300-2 low pass filters the data signals that are L-upsampled by the filtering units. Then through M-downsampling of the M-downsampling units 24 and 34, I and Q signals, respectively, are obtained.

According to the first, third and fourth embodiments, hardware for low pass filtering is reduced by half, and according to the second, and fifth and sixth embodiments, hardware for low pass filtering and multiplexing is reduced by half.

As described above with reference to the preferred embodiments of the present invention, the same results as results of a conventional I/Q demodulator in terms of I/Q signals are obtainable with less hardware by optimizing the hardware.

According to the present invention, a size of hardware for low pass filtering and multiplexing is reducible by as much as a half.

As the operation frequency of the low pass filtering and multiplexing is reduced by half, power consumption may also be reduced, too.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An In-phase/Quadrature-phase (I/Q) demodulator, comprising:
   a delay unit which delays an input data signal and outputs a delayed input signal;
   first and second decimation units which decimate the input data signal and the delayed input signal, respectively;
   a first multiplexer which multiplexes the decimated delayed input data signal and a negative of the delayed input signal to output an I signal;
   a second multiplexer which multiplexes the decimated non-delayed input data signal and a negative of the non-delayed input signal to output a Q signal; and
   first and second filters which filter the I and Q signals, to output effective I and Q signals, respectively.

2. The I/O demodulator of claim 1, wherein the first and second decimation units perform a 2-decimation.

3. The I/O demodulator of claim 1, further comprising:
   first and second L-upsampling units which L-upsample the I and Q signals output from the first and second multiplexers to provide the upsampled I and Q signals to the first and second filters; and
   first and second M-downsampling units which M-downsample the filtered I and Q signals.

4. The I/Q demodulator of claim 3, wherein the L of each L-upsampling unit is odd.

5. The I/Q demodulator of claim 3, wherein the L of each L-upsampling unit is even.

6. The I/Q demodulator of claim 1, wherein:
   the first multiplexer sequentially outputs the input data signal, a zero, a negative of the input data signal and a zero; and
   the second multiplexer sequentially outputs a zero, the input data signal, a zero and a negative of the input data signal.

7. An In-phase/Quadrature-phase (I/Q) demodulator, comprising:
   a delay unit which delays an input data signal and outputs a delayed input signal;
   first and second decimation units which decimate the input data signal and the delayed input signal, respectively;
   a first multiplexer which multiplexes the decimated delayed input data signal and a negative of the delayed input signal to output an I signal;

a second multiplexer which multiplexes the decimated non-delayed input data signal and a negative of the non-delayed input signal to output a Q signal;

first and second upsampling units which upsample the I and Q signals, respectively;

first and second filters which filter the upsampled I and Q signals, respectively; and first and second M-downsampling units which downsample the filtered I and Q signals, respectively, to output effective I and Q signals, respectively.

8. The I/O demodulator of claim 7, wherein the M of each M-downsampling unit is even.

9. The I/Q demodulator of claim 7, wherein the M of each M-upsampling unit is odd.

10. An In-phase/Quadrature-phase (I/Q) demodulator, comprising:

a first multiplexer which multiplexes an input signal and other signals to output an I signal;

a second multiplexer which multiplexes the input signal and the other signals to output a Q signal;

first and second upsampling units which upsample the I and Q signals, respectively;

first and second delay units which delay the upsampled I and Q signals, respectively;

first and second decimation units which decimate the delayed I and Q signals, respectively;

first and second low pass filters which filter the decimated I and Q signals; and first and second M-downsampling units which M-downsample the low pass filtered I and Q signals, to output effective I and Q signals, wherein the M of each M-downsampling unit is even.

11. The I/O demodulator of claim 10, wherein:

the first multiplexer sequentially outputs the input data signal, a zero, a negative of the input data signal and a zero; and the second multiplexer sequentially outputs a zero, the input data signal, a zero and a negative of the input data signal.

12. An In-phase/Quadrature-phase (I/Q) demodulator, comprising:

a first multiplexer which multiplexes an input signal and other signals to output an I signal;

a second multiplexer which multiplexes the input signal and the other signals to output a Q signal;

first and second upsampling units which upsample the I and Q signals, respectively;

a delay unit which delays the upsampled I signal;

first and second decimation units which decimate the delayed I signal and the Q signal, respectively;

first and second low pass filters which filter the decimated delayed I signal and the decimated Q signal, respectively; and first and second M-downsampling units which M-downsample the filtered decimated delayed I signal and the filtered decimated Q signal, to output effective I and Q signals, respectively, wherein the M of each M-downsampling unit is odd.

13. The I/Q demodulator of claim 12, wherein:

the first multiplexer sequentially outputs the input data signal, a zero, a negative of the input data signal and a zero; and the second multiplexer sequentially outputs a zero, the input data signal, a zero and a negative of the input data signal.

14. An In-phase/Quadrature-phase (I/Q) signal generating method, comprising:

delaying an input data signal and outputting a delayed input signal;

decimating the input data signal and the delayed input signal, respectively;

multiplexing the decimated delayed input data signal and a negative of the delayed input signal to output an I signal;

multiplexing the decimated non-delayed input signal and a negative of the non-delayed input signal to output a Q signal; and filtering the I and Q signals, to output effective I and Q signals, respectively.

15. The I/Q signal generating method of claim 14, further comprising:

L-upsampling the I and Q signals output; and

M-downsampling the filtered I and Q signals.

16. The I/Q signal generating method of claim 15, wherein the L of the L-upsampling is odd.

17. The l/Q signal generating method of claim 15, wherein the L of the L-upsampling is even.

18. The I/O signal generating method of claim 14, wherein the decimating performs a 2-decimation.

19. The I/Q signal generating method of claim 14, wherein:

the I signal is sequentially output as the input data signal, a zero, a negative of the input data signal and a zero; and the Q signal is sequentially output as a zero, the input data signal, a zero and a negative of the input data signal.

20. An In-phase/Quadrature-phase (I/Q) signal generating method, comprising:

delaying an input data signal and outputting a delayed input data signal;

decimating the input data signal and the delayed input signal, respectively;

multiplexing the decimated delayed input data signal and a negative of the delayed input signal to output an I signal and a Q signal;

upsampling the I and Q signals, respectively;

filtering the upsampled I and Q signals, respectively; and downsampling the filtered I and Q signals, respectively, to output effective I and Q signals, respectively.

* * * * *

UNITED STATES PATENT AND TRADEMARK OFFICE
CERTIFICATE OF CORRECTION

PATENT NO. : 7,221,718 B2
APPLICATION NO. : 10/354078
DATED : May 22, 2007
INVENTOR(S) : Chan-sub Park It is certified that error appears in the above-identified patent and that said Letters Patent is hereby corrected as shown below:

Column 12, Line 37, change "I/O" to --I/Q--.

Column 12, Line 39, change "I/O" to --I/Q--.

Column 13, Line 11, change "I/O" to --I/Q--.

Column 13, Line 33, change "I/O" to --I/Q--.

Column 14, Line 31, change "1/Q" to --I/Q--.

Column 14, Line 33, change "I/O" to --I/Q--.

Signed and Sealed this

Eighteenth Day of March, 2008

JON W. DUDAS
*Director of the United States Patent and Trademark Office*